(12) United States Patent
Issa

(10) Patent No.: US 6,650,572 B2
(45) Date of Patent: *Nov. 18, 2003

(54) COMPACT ANALOG-MULTIPLEXED GLOBAL SENSE AMPLIFIER FOR RAMS

(75) Inventor: Sami Issa, Phoenix, AZ (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/224,841

(22) Filed: Aug. 21, 2002

(65) Prior Publication Data

US 2003/0021159 A1 Jan. 30, 2003

Related U.S. Application Data

(63) Continuation of application No. 09/976,236, filed on Oct. 12, 2001, now Pat. No. 6,480,424.
(60) Provisional application No. 60/304,860, filed on Jul. 12, 2001.

(51) Int. Cl.[7] .................................... G11C 16/04
(52) U.S. Cl. .................. 365/189.02; 365/205; 365/190
(58) Field of Search ............. 365/189.02, 205, 365/190, 189.01, 207, 230.03, 230.04

(56) References Cited

U.S. PATENT DOCUMENTS

| | | |
|---|---|---|
| 6,009,024 A | 12/1999 | Hirata et al. |
| 6,031,775 A | 2/2000 | Chang et al. |
| 6,363,023 B2 * | 3/2002 | Andersen et al. ........... 365/207 |
| 6,480,424 B1 * | 11/2002 | Issa ....................... 365/189.02 |

\* cited by examiner

*Primary Examiner*—David Lam
(74) *Attorney, Agent, or Firm*—Christie, Parker & Hale, LLP

(57) ABSTRACT

The method and system of the present invention superimposes read and write operations by connecting the global bit lines that are not selected to the Vdd. As a result, the respective local sense amplifiers for the non-selected global bit lines will just read and refresh the respective memory cells. This new approach results in smaller local sense amplifiers and one global sense amplifiers for several memory cells (and local sense amplifiers).

In one embodiment, eight global bit lines are shared by one global sense amplifier and multiplexed to achieve the advantages of the present invention. Due to an analog global multiplexing scheme used by the present invention, only one global bit line pair generates voltage development as an input to a respective local sense amplifier during a write operation, while the other three global bit line pairs are disconnected from their respective local sense amplifiers and thus have no voltage development. The global bit line pairs with no voltage development generate zero voltage development on the local bit lines and the respective activated sense amplifiers amplify only the cell data which reassembles a read and refresh operation.

17 Claims, 12 Drawing Sheets

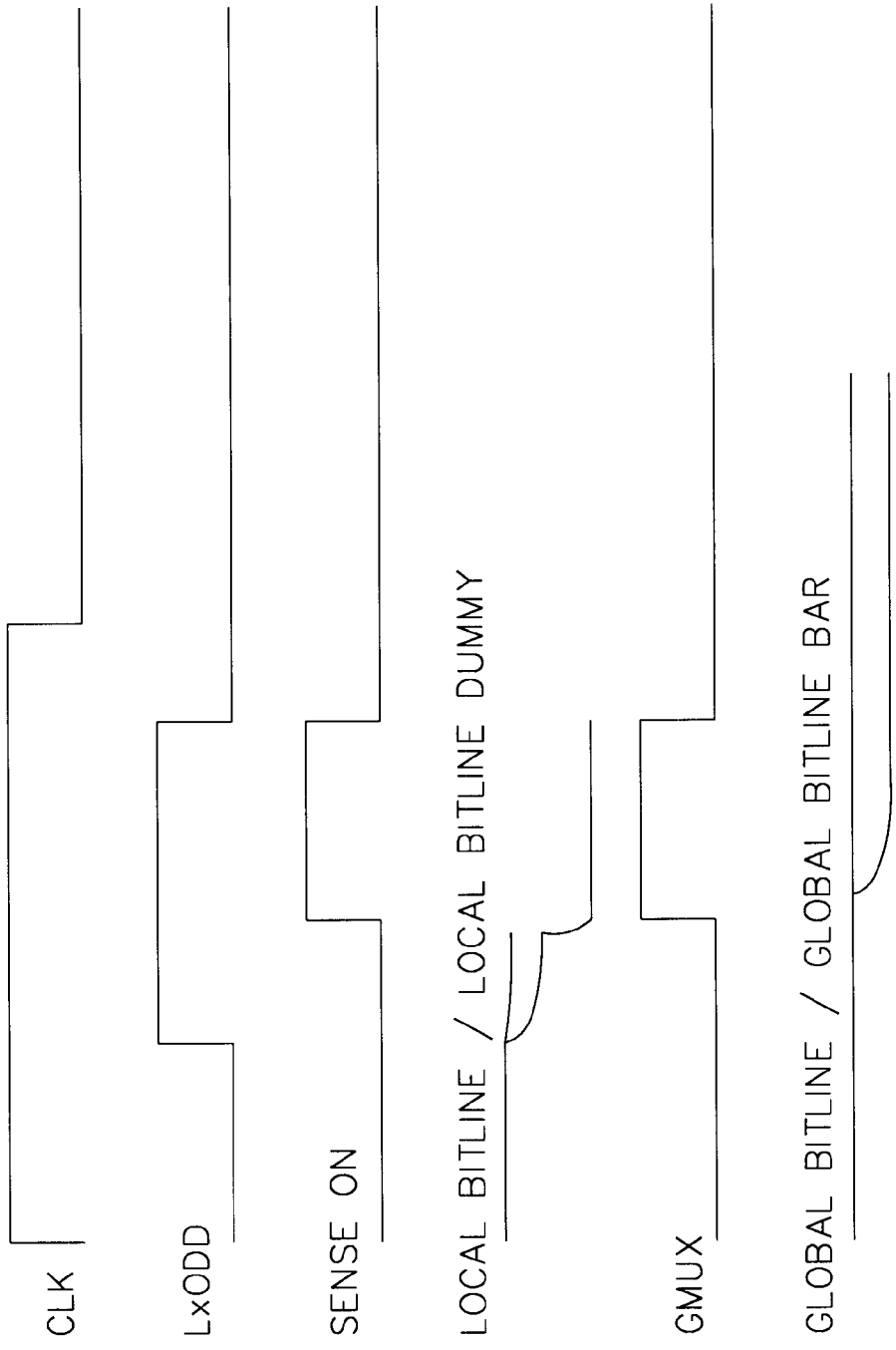

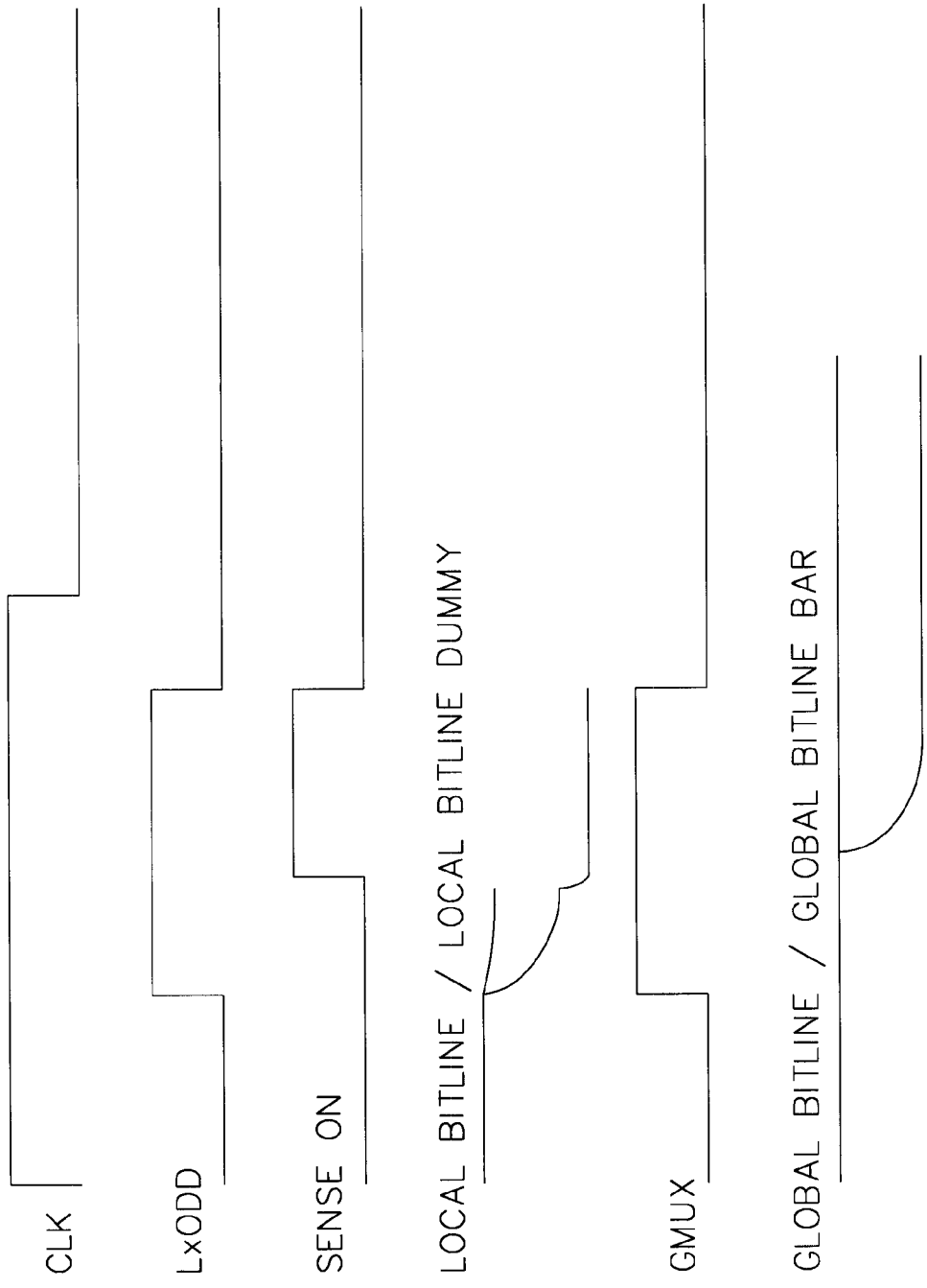

COMPACT ANALOG-MULTIPLEXED GLOBAL SENSE AMPLIFIER FOR RAMS

CROSS-REFERENCE TO RELATED APPLICATIONS

This application is a continuation of U.S. patent application Ser. No. 09/976,236, filed Oct. 12, 2001, now U.S. Pat. No. 6,480,424 and entitled "COMPACT ANALOG-MULTIPLEXED GLOBAL SENSE AMPLIFIER FOR RAMS", which claims the benefit of the filing date of U.S. Provisional Patent Application Serial No. 60/304,860, filed Jul. 12, 2001 and entitled "COMPACT ANALOG-MULTIPLEXED GLOBAL SENSE AMPLIFIER FOR DRAM/SRAM MEMORIES"; the entire contents of which are hereby expressly incorporated by reference.

FIELD OF THE INVENTION

The present invention relates to random access memories (RAMs). More specifically, the invention relates to an efficient read/write method and apparatus for RAMs.

BACKGROUND OF THE INVENTION

RAM devices have become widely accepted in the semiconductor industry. Furthermore, SOC devices typically include internal RAM for storage of information such as instructions and/or data. Internal memory blocks in an SOC device (e.g., a routing chip) typically occupy substantial chip area of an integrated circuit (IC) chip that contains the SOC device. For example, internal memory blocks may occupy as much as about 70% of the IC chip area of an SOC device. The configuration of internal memory in SOC devices is generally similar to the configuration of memory in individual memory chips.

Each block of RAM includes a number of memory cells. Each memory cell typically stores one bit of information. Typical RAM blocks have capacity to store anywhere from thousands to millions of bits of data. Since vast numbers of memory cells are used to store information in RAM blocks, the size of RAM blocks depends, to large extent, on the size of each memory cell.

A conventional memory cell of a static random access memory (SRAM) is typically made up of six transistors in a 6T configuration. Memory cells in dynamic random access memory (DRAM) blocks typically require less number of transistors per bit. DRAMs typically cost less to produce than other types of memory devices due to their relative simplicity. For example, some DRAM blocks contain memory cells with three transistor (3-T) per bit, while other DRAM blocks contain memory cells with one transistor (1-T) per bit. Therefore, DRAM blocks of SOC devices and DRAM chips are typically smaller than SRAM blocks with similar information storage capacity.

However, DRAM cells need to be refreshed periodically for retaining the stored charge. A typical refresh operation comprises of selecting a (group of) memory cell(s), reading the stored values, and writing the stored values back to the respective cells. A typical write operation involves writing the desired data value to the global bit lines to be written to the respective local sense amplifiers. The respective local sense amplifiers then amplify the written values and make the respective local bit lines go either in the same voltage direction as the originally stored values or the opposite direction of the stored value. In order to be able to drive the local bit line to an opposite value, the global bit lines should be designed in such a way to have higher driving capabilities.

In existing DRAMs, global multiplexing information is delivered to the local sense amplifier to prevent erroneous writing to the respective memory cell. This approach gives rise to complicated local sense amplifiers, less area efficiency, and limited multiplexing depth.

Therefore, there is a need for a RAM structure that takes less area, improves core to periphery efficiency, and achieves a better (constant) aspect ratio.

SUMMARY OF THE INVENTION

The present invention, modifies the write operation timing to achieve analog global multiplexing with no impact on local sense amplifier area and design complexity. The present invention describes a method and system by which analog multiplexing is used at a global level in hierarchical memories such as Read Only Memories (RAMs) used in system-on-chip (SOC). The advantage of using analog multiplexing at the global level is to reduce area and improve core to periphery efficiency. A further advantage is achieving a better (constant) aspect ratio for wide spectrum memory configurations.

The method and system of the present invention superimposes read and write operations by connecting the global bit lines that are not selected to the Vdd. As a result, the respective local sense amplifiers for the non-selected global bit lines will just read and refresh the respective memory cells. This new approach results in smaller local sense amplifiers and one global sense amplifiers for several memory cells (and local sense amplifiers).

In one aspect, the present invention is a RAM with analog multiplex sensing means comprising an odd block of data cells including a plurality of data cell subsets, wherein each of the data cell subsets is coupled to a respective odd bit line; an even block of data cells including a plurality of data cell subsets, wherein each of the data cell subsets is coupled to a respective even bit line; a plurality of local sense amplifiers positioned between the odd block of data cells and the even block of data cells, each local sense amplifier of the plurality of local sense amplifiers is shared by a respective odd bit line, a respective even bit line, and a respective global bit line; a global sense amplifier electrically coupled to a subset of the plurality of local sense amplifiers by a set of respective global bit lines and having a higher signal driving capability than each of the plurality of local sense amplifiers, wherein one of the set of respective global bit lines is selected for superimposing a signal development on a respective local bit line to be sensed by a respective local sense amplifier and wherein, other global bit lines in the set of respective global bit lines are decoupled from the respective local sense amplifiers.

In another aspect, the present invention is a RAM having a plurality of local bit lines and a plurality of global bit lines comprising means for coupling a local bit line of the plurality of local bit lines to a respective global bit line of the plurality of global bit lines; means for selecting a local bit line of the plurality of local bit lines and a respective global bit line of the plurality of global bit lines for a write operation; and means for coupling non-selected global bit lines to a vdd signal.

BRIEF DESCRIPTION OF THE DRAWINGS

The objects, advantages and features of this invention will become more apparent from a consideration of the following detailed description and the drawings, in which:

FIGS. 9A and 9B are simplified timing diagrams for the read and write operations respectively, according to one embodiment of the present invention;

DETAILED DESCRIPTION

Present invention describes a new design and architectural arrangement that allows for efficient analog multiplexing of global bit lines. In one aspect of the invention, the read and write operations are superimposed so that the global data lines may be utilized to multiplex N number of global bit lines. In one embodiment, eight global bit lines are shared by one global sense amplifier, although any number of global bit lines may be shared by a global sense amplifier and multiplexed to achieve the advantages of the present invention. Due to an analog global multiplexing scheme used by the present invention, only one global bit line pair generates voltage development as an input to a respective local sense amplifier during a write operation, while the other three global bit line pairs are disconnected from their respective local sense amplifiers and thus have no voltage development. The global bit line pairs with no voltage development generate zero voltage development on the local bit lines and the respective activated sense amplifiers amplify only the cell data which reassembles a read and refresh operation.

Figure 1:
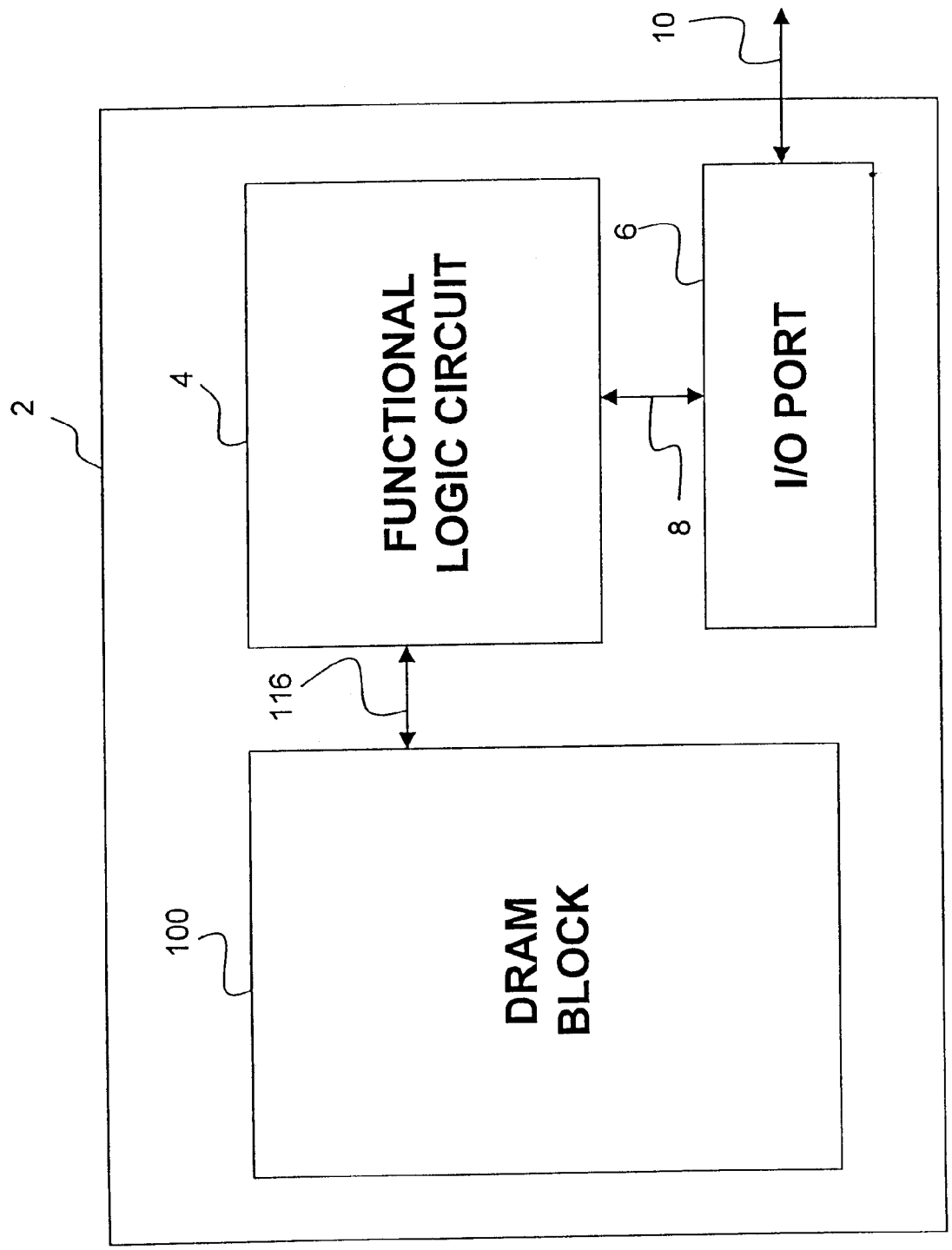
FIG. 1 is an exemplary block diagram of a system-on-chip (SOC) device that includes a dynamic random access memory (DRAM) block, according to one embodiment of the present invention.

FIG. 1 is a block diagram of a system-on-chip (SOC) device 2. The SOC device 2 preferably includes a functional logic circuit 4 for data processing. The functional logic circuit 4 preferably communicates with external devices using an I/O port 6 over an I/O interface 8. The I/O port 6 transmits and receives data to and from the external devices over an external interface 10. The SOC device 2 also includes a DRAM block 100. The DRAM block 100 may be used to store data and information for data processing by the functional logic circuit 4. The functional logic circuit preferably accesses the data and/or information used during data processing over a data bus 116. For example, the SOC device 2 may be a high speed switch chip. In the high speed switch chip, the DRAM block 100 may typically store information regarding source and destination of data packets. In the high speed switch chip, the I/O port 6 may be a transceiver for receiving and transmitting the data packets. The functional logic circuit 4 in the high speed switch chip may be used to switch or route the incoming data packets to external devices based on the information stored in the DRAM block 100.

Figure 2:
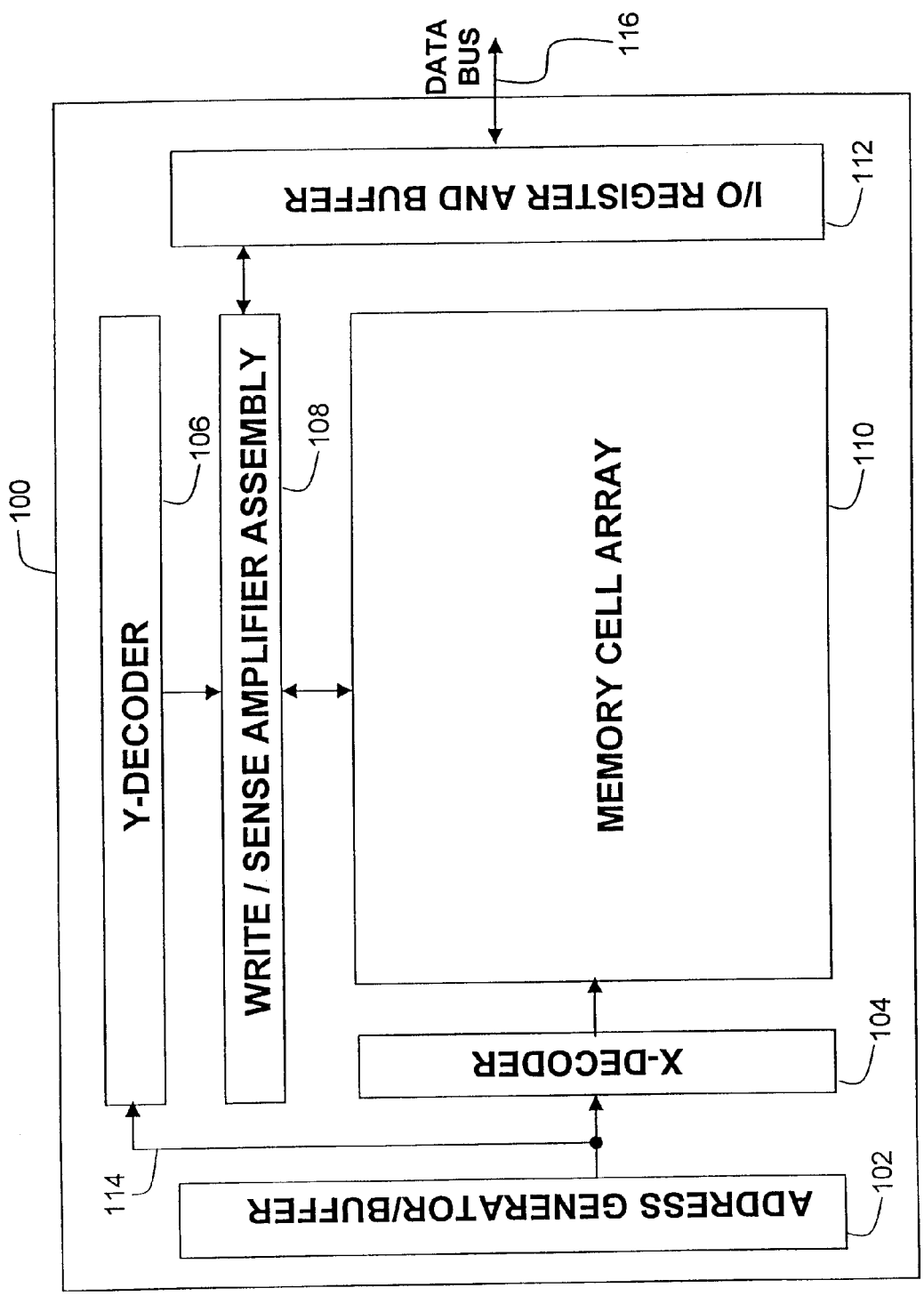
FIG. 2 is an exemplary block diagram of a RAM block of an SOC device or a RAM chip, according to one embodiment of the present invention.

FIG. 2 is an exemplary block diagram of the DRAM block 100. The DRAM block 100 may be used as a part of an SOC device as in FIG. 1, or as a part of an individual DRAM chip. The DRAM block 100 preferably includes a memory cell array 110. The memory cell array 110 includes a number of memory cells. The memory cells in the memory cell array 110 are organized into rows and columns.

The DRAM 100 also includes a sense amplifier assembly 108. The sense amplifier assembly 108 includes multiple sense amplifiers. In one embodiment, sense amplifier assembly 108 includes four local sense amplifiers and one global sense amplifier for each sixteen DRAM cell. The sense amplifiers are used to write to the memory cells and read contents of the memory cells.

The number of rows and columns of memory cells in the memory cell array 110 determines the information storage capacity of the DRAM block. The number of bits that the DRAM block 100 stores may range from hundreds to hundreds of millions or more. The DRAM block 100 also includes a Y decoder 106. The Y decoder 106 receives address signals and selects the columns of memory cells in the memory cell array for reading, writing and refreshing operations. In other words, the Y decoder 106 decodes the address signals to generate column select signals to select columns in the memory cell array 110 for writing and reading, respectively.

The DRAM block 100 also includes an X decoder 104. The X decoder 104 is used to select rows of the memory cell array 110 for reading, writing and refreshing. The X decoder 104 receives address signals and decodes them to select one or more rows of the memory cell array. The DRAM block 100 also includes an address generator/buffer 102. The address generator/buffer 102 either generates addresses within the DRAM block or the addresses may be provided by a component or a device outside of the DRAM block. The address generator/buffer 102 provides the addresses 114 to the Y decoder 106 and the X decoder 104. The addresses 114 include an access address and a refresh address. The access address is used for normal memory cell access operations such as read and write. The refresh address is used for refreshing the memory cells.

In one embodiment, the DRAM block 100 also includes an I/O register and buffer 112. The I/O register and buffer 112 is used to temporarily store data bits to be written to the memory cells during writing operations. The I/O register and buffer 112 is also used to temporarily store data bits that are read from the memory cells. The I/O register and buffer 112 interfaces the memory cell array 110 to a memory data bus 116 through the sense amplifier assembly 108.

Figure 3:
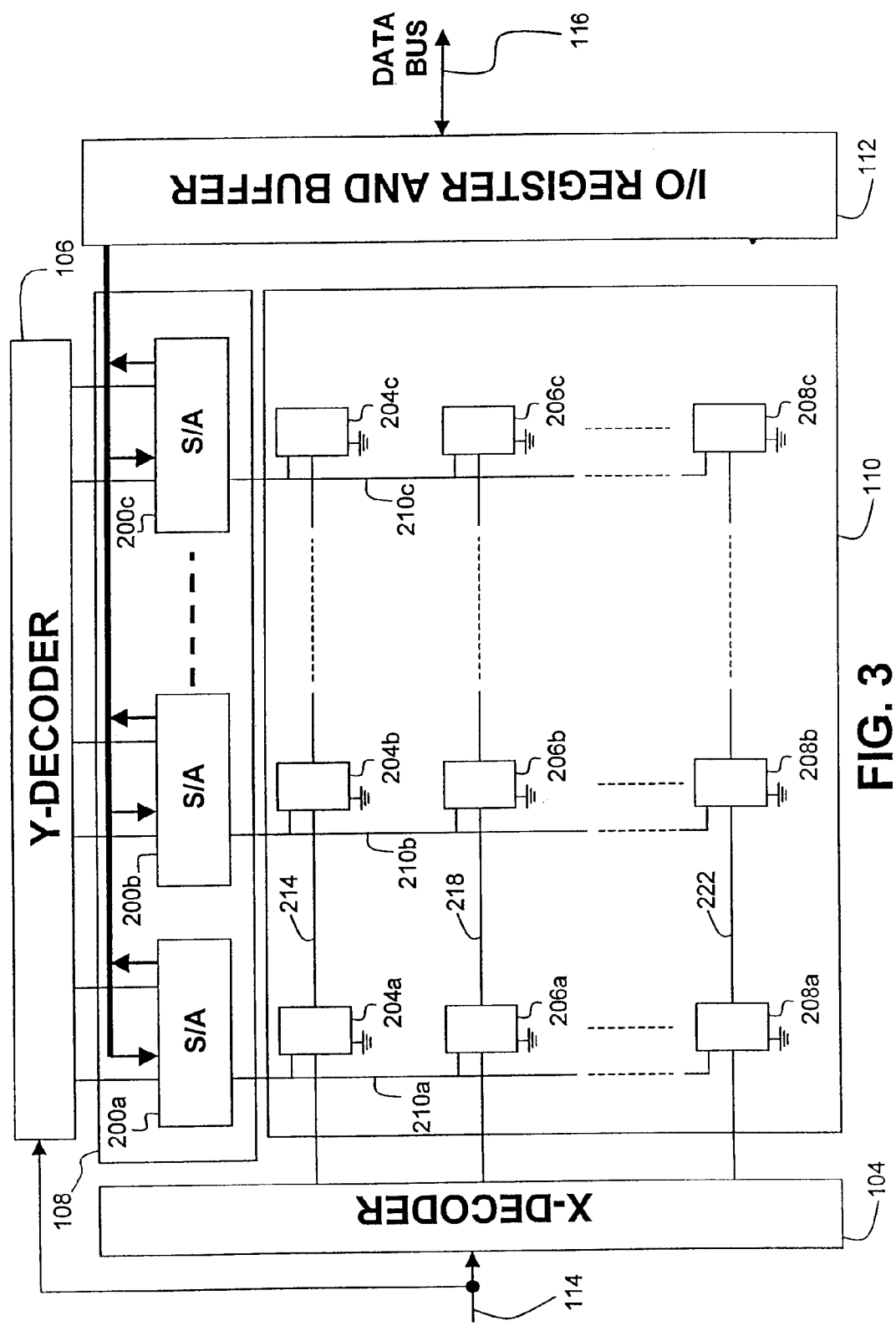
FIG. 3 is an exemplary block diagram that illustrates details of a sense amplifier assembly and a memory cell array, according to one embodiment of the present invention.

FIG. 3 is a block diagram that shows details of the memory cell array 110 and the sense amplifier assembly 108 in one embodiment of the present invention. Components of the memory cell array and the sense amplifier assembly, such as write amplifiers, sense amplifiers, memory cells, read bit lines, write bit lines, select lines, are shown in FIG. 3 for illustrative purposes only. The DRAM block of the present invention may include many more columns of memory cells and corresponding sense amplifiers. In addition, the DRAM block may include many more rows of memory cells.

The sense amplifier assembly 108 includes multiple sense amplifiers 200a, 200b and 200c. Several of these sense amplifiers may be combined together for several memory cells. For example, in one embodiment of the present invention, eight of the sense amplifiers form eight local sense amplifiers and are shared by sixteen memory cells and one global sense amplifier. This architecture minimizes the complexity, area, and cost of the memory.

In the one embodiment of the present invention, each of the memory cells in the memory cell array 110 is a 1-T cell that is associated with one write/read bit lines. Each of the write/read bit lines is used to write to the associated memory cells and read from the associated memory cells. The write/read bit lines are coupled to the sense amplifiers.

Memory cells 204a, 206a and 208a represent a first column of memory cells in the memory cell array 110. Memory cells 204b, 206b and 208b represent a second column of memory cells in the memory cell array 110. Memory cells 204c, 206c and 208c represent an mth column of memory cells in the memory cell array 110. Write/read bit line 210a is coupled to the first column of memory cells and couples the sense amplifier 200a to each of the memory cells 204a, 206a and 208a.

The X decoder 104 receives and decodes the addresses 114, and provides column select signal through select line 214, to a first row of memory cells 204a, 204b and 204c. The X decoder 104 also provides cell select signals through select line 218, to a second row of memory cells 206a, 206b and 206c. In addition, the X decoder 104 provides cell select signal through select line 222 to an nth row of memory cells 208a, 208b and 208c. The Y decoder 106 receives and decodes the addresses 114, and provides row (word) select signals to the sense amplifiers for writing to and reading from the respective memory cells.

Figure 4:
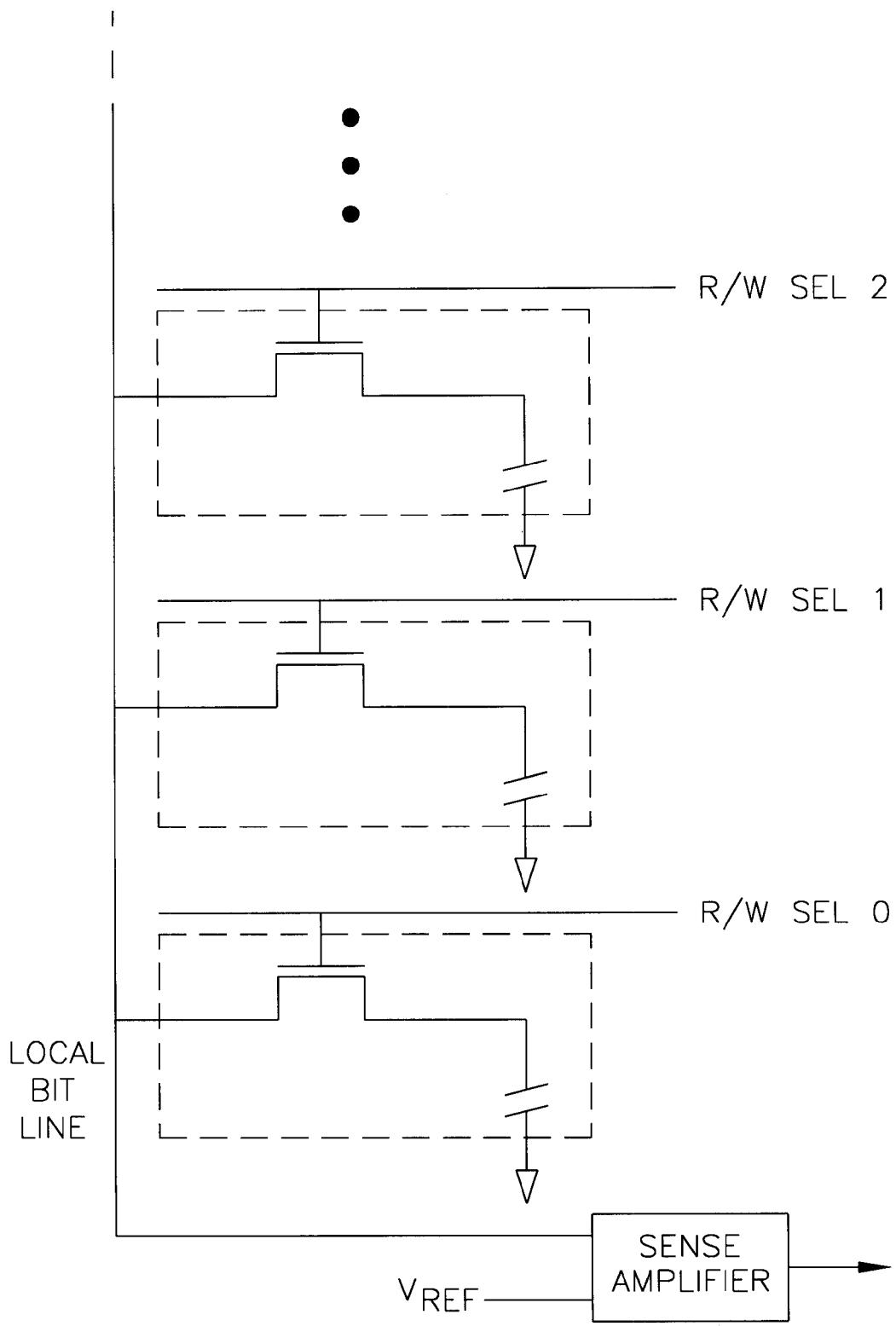
FIG. 4 is an exemplary detailed block diagram of a 1-T memory cell, according to one embodiment of the present invention.

Two exemplary 1-T memory cells are shown in FIG. 4. Each capacitor holds a charge corresponding to a written data, respectively. Each bit line carries data into and out of the respective cell. Each transistor switch is enabled by the respective word select line which is a function of the row address. The transistor switch is situated such that its source is connected to the capacitor, its drain is connected to the bit line, and its gate is connected to the word select line. As shown in FIG. 4, the 1-T cell design has only one line for both write and read signals.

In a typical RAM, the sense amplifier is a differential amplifier with one input connected to the bit line and the other input connected to a reference voltage Vref. If the voltage on the bit line is larger than the Vref, the differential sense amplifier outputs a logic high. Likewise, if the voltage on the bit line is smaller than the Vref, the differential sense amplifier outputs a logic low. In one embodiment, the present invention utilizes a relative simple design of a 4-transistor sense amplifier (shown in FIG. 10), augmented with two NMOS transistors to provide a fast and efficient sense amplifier that limits the voltage swing in the respective global bit lines for both read and write cycles.

Figure 5:
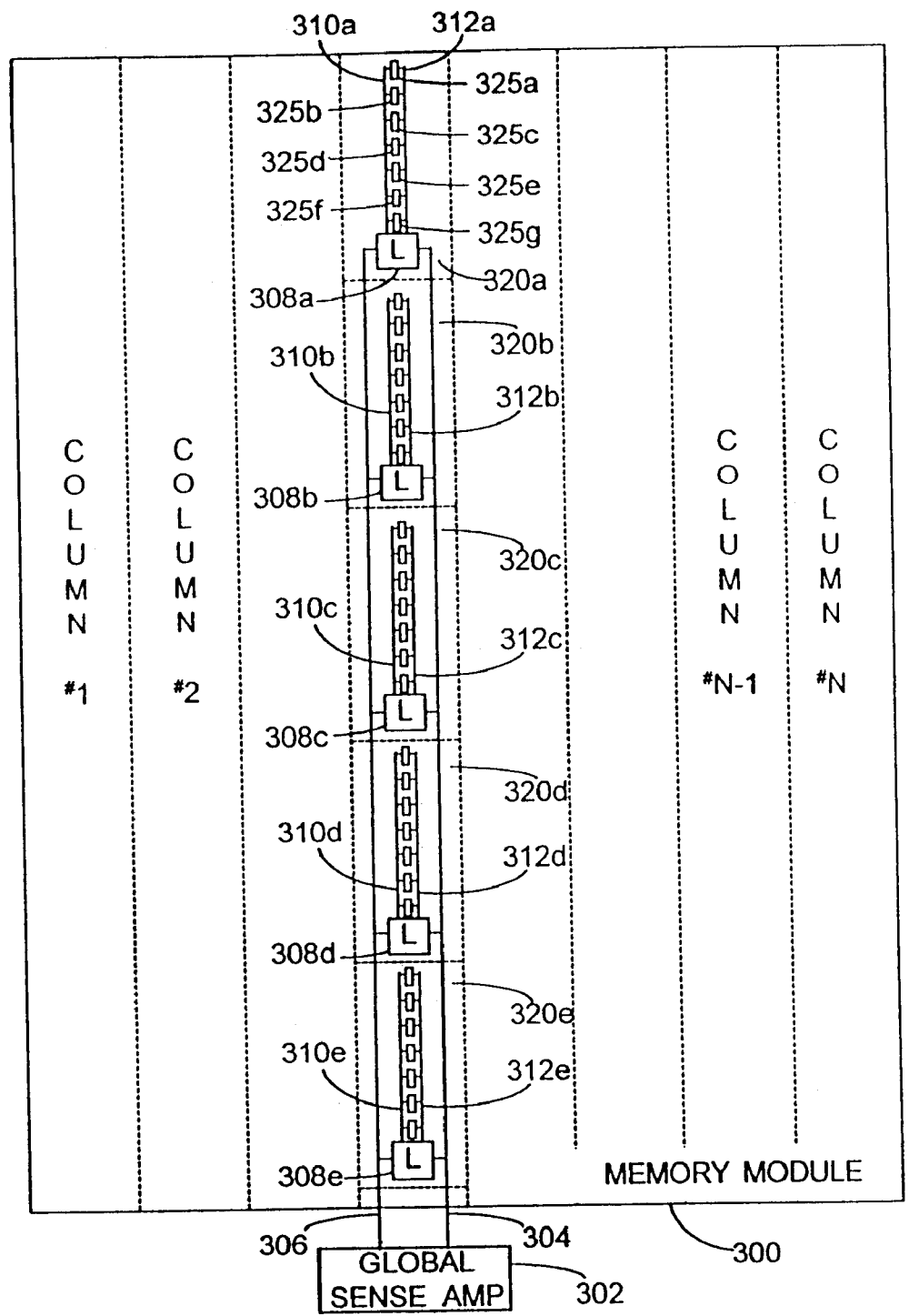
FIGS. 5 and 6 are exemplary block diagrams of a hierarchical memory module using local bit line sensing shared by a top and a bottom memory portion, according to one embodiment of the present invention.

FIG. 5 illustrates a memory block 300 formed by coupling multiple cooperating constituent modules 320a–e, with each of the modules 320a–e having a respective local sense amplifier 308a–e. Each module is composed of a predefined number of memory cells 325a–g, which are coupled with one of the respective local sense amplifiers 308a–e. Each local sense amplifiers 308a–e is coupled with global sense amplifier 302 via bit lines 304, 306. Because each of local sense amplifiers 308a–e sense only the local bit lines 310a–e, 312a–e, of the respective memory modules 320a–e, the amount of time and power necessary to precharge local bit lines 310a–e and 312a–e, are substantially reduced. Only when local sense amplifier 308a–e senses a signal on respective local lines 310a–e and 312a–e, does it provide a signal to global sense amplifier 302. This architecture adds flexibility and scalability to a memory architecture design because the memory size can be increased by adding locally-sensed memory modules such as 320a–e.

Increasing the number of local sense amplifiers 308a–e attached to global bit lines 304, 306, does not significantly increase the loading upon the global bit lines, or increase the power consumption in global bit lines 304, 306 because signal development and precharging occur only in the local sense amplifier 308a–e, proximate to the signal found in the memory cells 325a–g within corresponding memory module 320a–e.

In general, the cores of localized sense amplifiers 308a–e can be smaller than a typical global sense amplifier 302, because a relatively larger signal develops within a given period on the local sense amplifier bit lines, 310a–e, 312a–e. That is, there is more signal available to drive local sense amplifier 308a–e. In a global-sense-amplifier-only architecture, a greater delay occurs while a signal is developed across the global bit lines, which delay can be decreased at the expense of increased power consumption. Advantageously, local bit sensing implementations can reduce the delay while simultaneously reducing consumed power.

In certain aspects of the invention herein, a limited swing driver signal can be sent from the active local sense amplifier to the global sense amplifier. A full swing signal also may be sent, in which case, a very simple digital buffer, may be used. However, if a limited swing signal is used, a more complicated sense amplifier may be needed. For a power constrained application, it may be desirable to share local sense amplifiers among two or more memory modules. Sense amplifier sharing, however, may slightly retard the bit signal development line indirectly because, during the first part of a sensing period, the capacitances of each of the top and the bottom shared memory modules are being discharged. However, this speed decrease can be minimized and is relatively small, when compared to the benefits gained by employing logical sense amplifiers over the existing global-only architectures.

Figure 6:
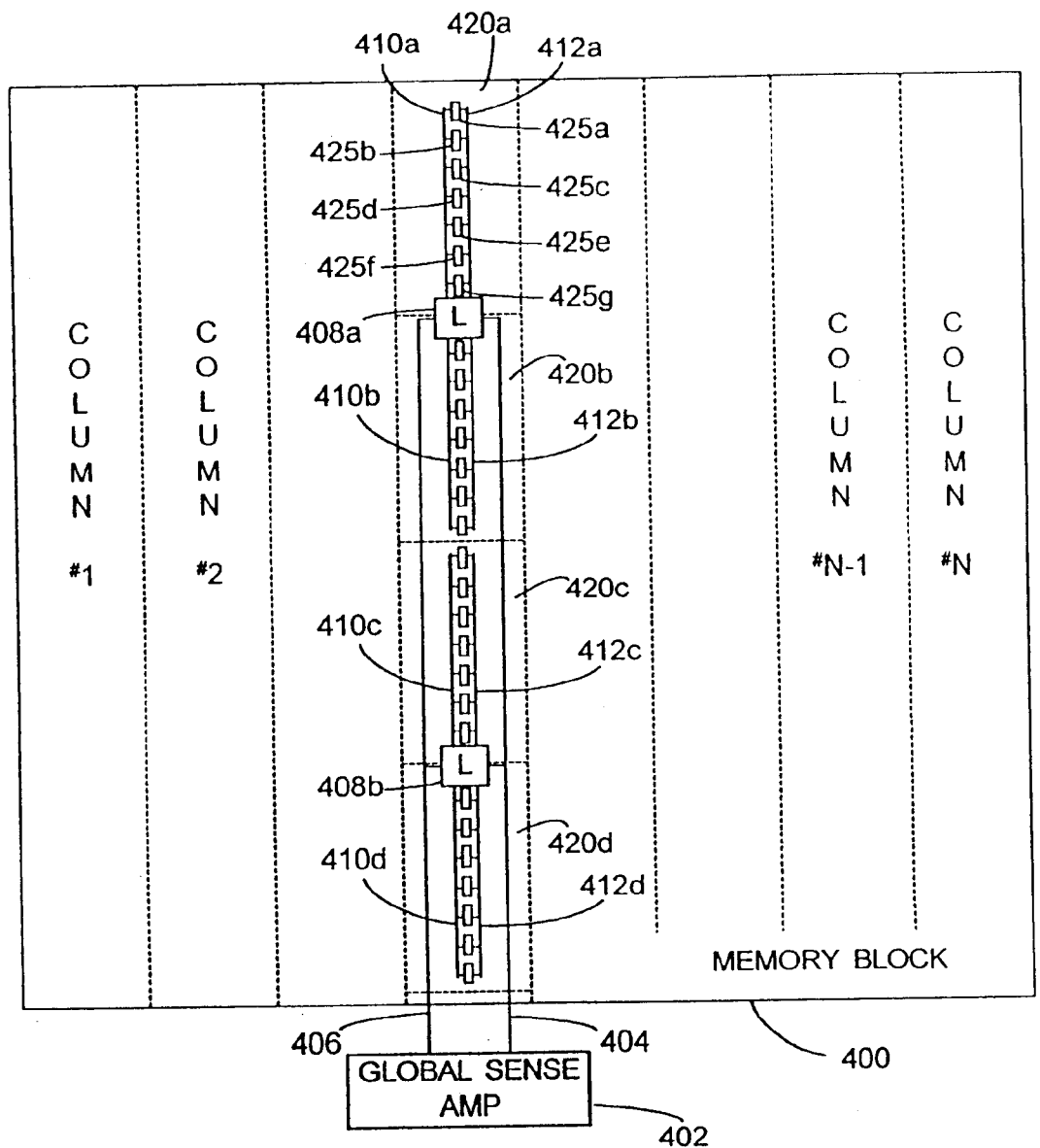

FIG. 6 shows a memory structure 400, which is similar to structure 300 in FIG. 5, by providing local bit line sensing of modules 420a–d. Each memory module 420a–d is composed of a predefined number of memory cells 425a–g. Memory cells 425a–g are coupled with respective local sense amplifier 408a, b via local bit lines 410a–d, 412a–d. Unlike structure 300 in FIG. 5, where each module 320a–e has its own local sense amplifier 308a–e, memory modules 420a–d are paired with a single sense amplifier 408a, b. Similar to FIG. 5, FIG. 6 shows global sense amplifier 402 being coupled with local sense amplifiers 408a, 408b.

Figure 7:
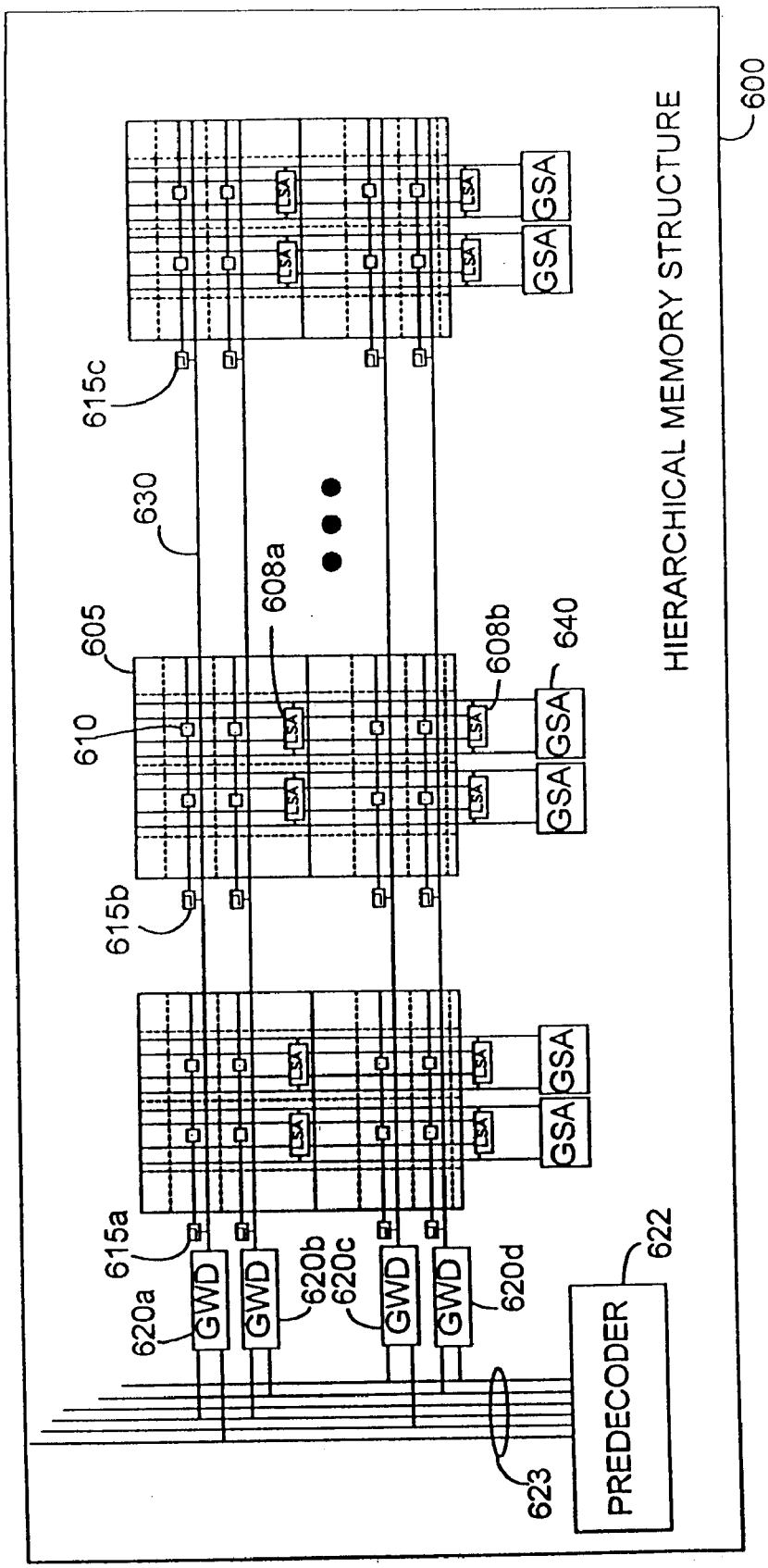
FIG. 7 is an exemplary block diagram of a hierarchical memory module, according to one embodiment of the present invention.

FIG. 7 illustrates a hierarchical structure 600 having hierarchical word-line decoding in which each hierarchical memory module 605 is composed of a predefined number of memory cells 610, which are coupled with a particular local word line decoder 615a–c. Each local word line decoder 615a–c is coupled with a respective global word line decoder 620. Each global word line decoder 620a–d is activated when predecoder 622 transmits address information relevant to a particular global word line decoder 620a–d via predecoder lines 623. In response, global word line decoder 620a–d activates global word line 630 which, in turn, activates a particular local word line decoder 615a–c. Local word line decoder 615a–c then enables associated memory module 605, so that the particular memory cell 610 of interest can be evaluated. Global sense amplifier 640 is coupled with local sense amplifiers 608a and 608b.

Each of memory modules 605 can be considered to be an independent memory component to the extent that the hierarchical functionality of each of modules 605 relies upon local sensing via local sense amplifiers 608a–b, local decoding via local word line decoders 615a–c, or both. The memory modules 605 may be memory blocks or memory banks within a memory block. Multiple memory devices 600 can be arrayed coupled with global bit lines or global decoding word lines, to create a composite memory component of a desired size and configuration.

Long bit or word lines can present a problem, particularly for a write operations, because the associated driver can be limited by the amount of power it can produce, and the speed at which sufficient charge can be built-up upon signal lines.

Although FIG. 7 shows hierarchical word line decoding used in conjunction with hierarchical bit line operations, hierarchical word-line decoding can be implemented without hierarchical bit line sensing. It is preferred to use both the hierarchical word line decoding, and the hierarchical bit line sensing to obtain the synergistic effects of decreased power and increased speed for the entire device.

Figure 8:
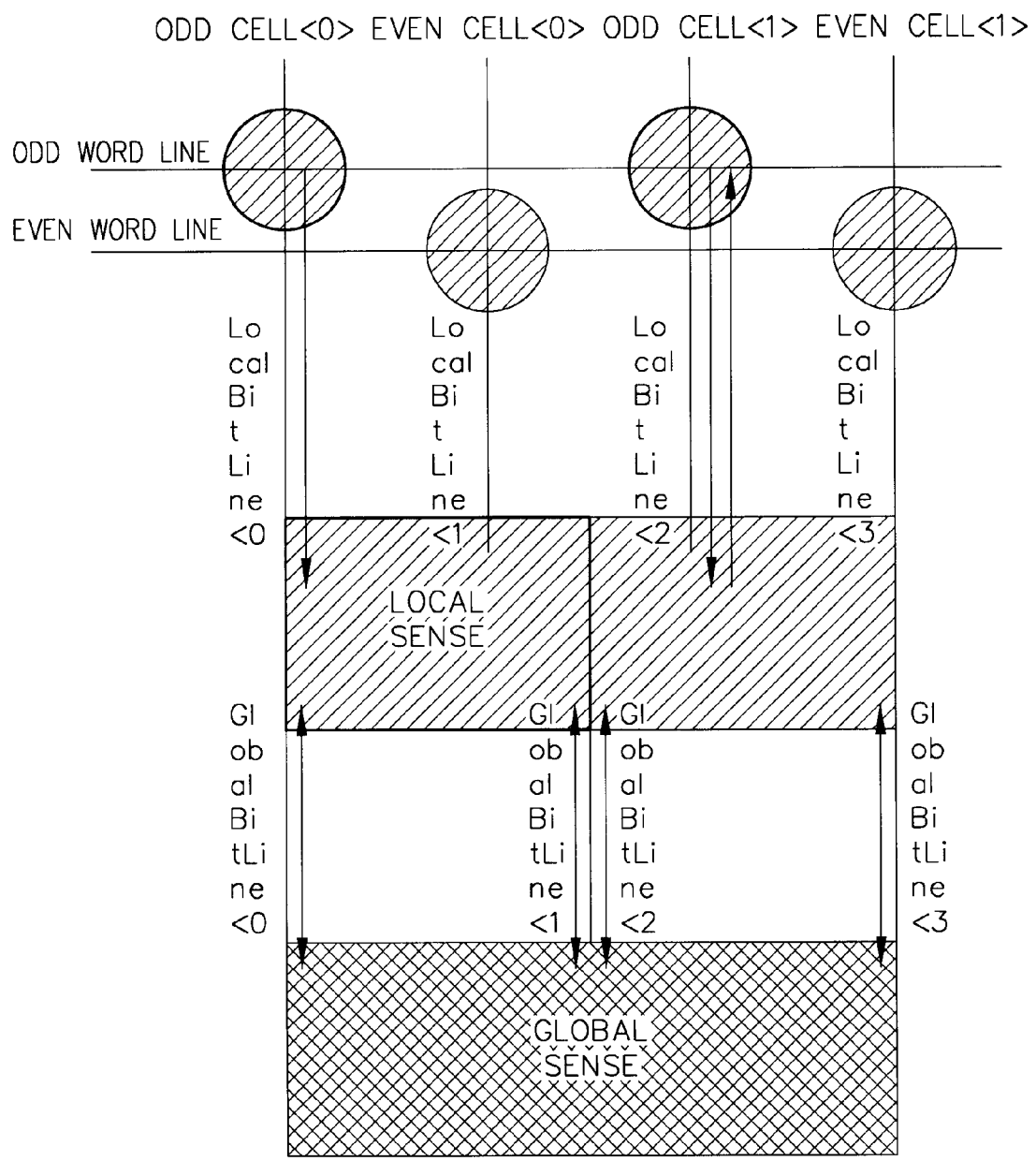
FIG. 8 is an exemplary architectural arrangement, according to one embodiment of the present invention.

FIG. 8 is an exemplary architectural arrangement according to one embodiment of the present invention. In this architecture, the DRAM arrays are divided into odd and even halves, both halves are identical copies of each other and are positioned such that every two DRAM cells share a local sense amplifier. The global sense amplifier block is shared between sixteen DRAM cells and eight local sense amplifiers. For simplicity reasons, only four memory cells, two local sense amplifiers, and one-quarter of the global sense amplifier are shown in FIG. 8.

For the area of every sixteen DRAM cells, this arrangement provides one global sense amplifier resulting in a reduced layout area and thus cost of memory chips or SOC. Although, an odd/even architecture for a DRAM is chosen as an example to describe some aspects of the present invention, the present invention works with any hierarchical memory, including 1-T, 3-T DRAMs, and also SRAMs.

FIGS. 9A and 9B are simplified timing diagrams for the read and write operations, respectively. During a read operation, local odd driver activates (LxOdd) and all odd DRAM cells get activated. Odd DRAM cell data are placed on the odd local bit lines, creating differential voltage development with respect to un-activated even local bit lines. After fixed delay, all the local sense amplifiers activate (SenseOn). GMux signal connects the respective sense amplifiers to global bit lines to place amplified DRAM cell data on the global bit lines, while other sense amplifiers are used only to refresh the DRAM cell data. A limited swing development on the global bit lines is amplified at the global sense amplifier and stored in global latch. The limited swing development helps reduce power consumption and decrease access time. Therefore, the local sense amplifiers that are performing a write operation have a voltage development on their respective global bit lines.

During a write operation, data to be written to the respective cell is placed on the global bit lines early in the cycle, as shown by early occurrence of the GMux signal in FIG. 9B. The respective local sense amplifier activates and connects to global bit line. Simultaneously, odd DRAM cells activate and connect to the local bit lines by the LxOdd, as shown in FIG. 9B. As a result, both local bit line and the respective global bit line are connected to the local sense amplifier. Local bit line voltage development driven by the DRAM cell superimposes on voltage development driven by the global bit line. Since, the global bit line is driven by stronger drivers, its voltage development is guaranteed by design to be greater than maximum development driven by the DRAM cell. After a fixed delay to allow for the DRAM cell to drive the local bit line to its respective voltage, respective local sense amplifiers activate and amplify final development to write to the odd DRAM cells. The non-selected global bit lines of the global sense amplifier are precharged to Vdd and remain connected to Vdd and thus are disconnected from the respective local sense amplifiers.

Because the even RAM cells are not selected, the respective local sense amplifiers, activate only to refresh DRAM cells similar to read operation. Due to the analog global multiplexing, only one global bit line pair generates voltage development, while 3 global bit line pairs have no voltage development because they are disconnected from the respective local sense amplifier by a switch transistor. The global bit line pairs with no voltage development are disconnected from the local bit lines, and the respective activated sense amplifiers amplify the cell data only which reassembles read operation.

In one embodiment, each local sense amplifier contains a dummy DRAM cells with half the drive strength. Similar, to the non-activate odd/even word line of FIG. 8, the dummy cells perform the function of generating a Vref that tracks process and temperature variations of the data cell. In the case of a 3-T cell, the dummy cells are replicas of a 3-T memory cell with half the drive capability. In the case of a 1-T cell, the dummy cells are a replica of a 1-T memory cell with half the capacitance and thus half the drive capability to mimic the load and temperature/process variation of a cell and a local bit line.

During pre-charge period read/write bit lines are connected to Vdd. When an access is requested, the dummy cell is turned on and the sense amplifier compares between the selected bit line and the bottom dummy cell, to make a decision. Since the dummy cell is driven with half driving capability of the selected bit line, it behaves as a reference voltage at the midpoint of a high and a low logic. This reference voltage tracks the temperature and process variations of the DRAM. The dummy cell is made to be a replica of the core cells with one-half the drive strength. This arrangement provides a superior temperature and process tracking.

Figure 10:
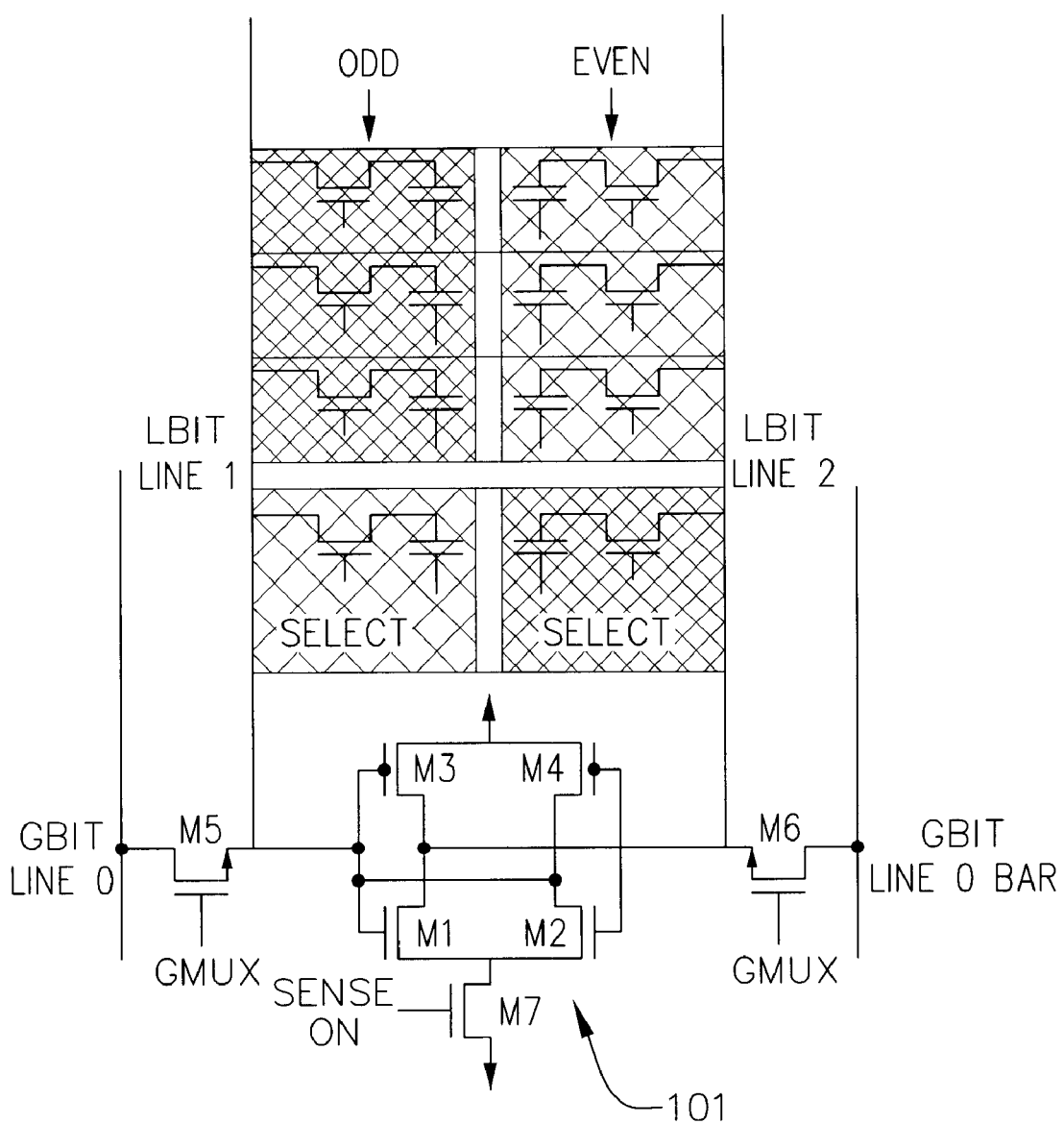
FIG. 10 is an exemplary block diagram of a local sense amplifier 101 shared by two memory cells, according to one embodiment of the present invention.

FIG. 10 is an exemplary block diagram of a local sense amplifier 101 shared by two memory cells, according to one embodiment of the present invention. In this embodiment, the differential local sense amplifier 101 configured as two cross-coupled latches is placed between and is shared by two adjacent odd memory column and even memory column. The Local bit line 1 (LbitLine 1) reads a respective memory cell from the odd column and feeds the charge (voltage) to the sense amplifier 101. The output of the sense amplifier 101 is connected to global bit line 0 (GbitLine 0) through the NMOS transistor M5. The charge (voltage) on the GbitLine 0 is then sensed by a global sense amplifier (not show) before it is outputted from the DRAM.

In one embodiment, the sense amplifier 101 includes two NMOS transistors M1 and M2 and two PMOS transistors M3 and M4 configured as a latch. Two NMOS transistors M5 and M6 act as a gate switch and are driven by the GMux signal shown in FIGS. 9A and 9B. These transistors behave as a gate between the respective local bit lines to the respective global bit lines. The NMOS transistor M7 behaving as a current sink, is driven by the SenseOn signal drives the sources of M1 and M2 to ground when SenseOn signal is on to provide better voltage swing for the sense amplifier 101. The relative simple design of the 4-transistor sense amplifier of FIG. 10 is augmented with the two NMOS transistors M5 and M6 to provide a fast and efficient sense amplifier that limits the voltage swing in the respective global bit lines for both read and write cycles.

The local bit lines are at a high ("1") voltage level when they are not being driven. In operation, when a "1" is being written to a memory location with a stored "0" logic, LbitLine 0 reads a "0" from the respective memory cell and the cell capacitor of that memory cell drives the Lbitline 0 low. A short time later, GMux signal turns on, which turns on the NMOS transistor M5, connecting the GbitLine 0 to LbitLine 0.

Switch transistors M5 and M6 are turned on by GMux and connect the global bit line to the local bit line. The data to be written (a logic "1" in this case) is placed on the global bit line that has a stronger driving capability. As a result, global bit line drives one input of the local sense amplifier 101 high, while the other input is driven low. The latch configuration of the sense amplifier reinforces the voltage difference between the LbitLine 1 and LbitLine 2 and outputs a high voltage to be written to the cell. Because GbitLine 0 does not have to go through a full voltage swing, this design results in saving of power and a faster response time.

When a logic "0" is being written to a memory location with a stored "1" logic, LbitLine 1 is reading a 1 from the respective memory cell and the Lbitline 1 remains at a high voltage level. A short time later, GMux signal turns on which turns on the NMOS transistor M5, connecting the GbitLine to LbitLine 1. The data to be written (a logic "0" in this case) is placed on the global bit line that has a stronger driving capability. As a result, global bit line drives one input of the local sense amplifier 101 low. Because GbitLine 0 does not have to go through a full voltage swing by design, this design results in saving of power and a faster response time.

Figure 11:
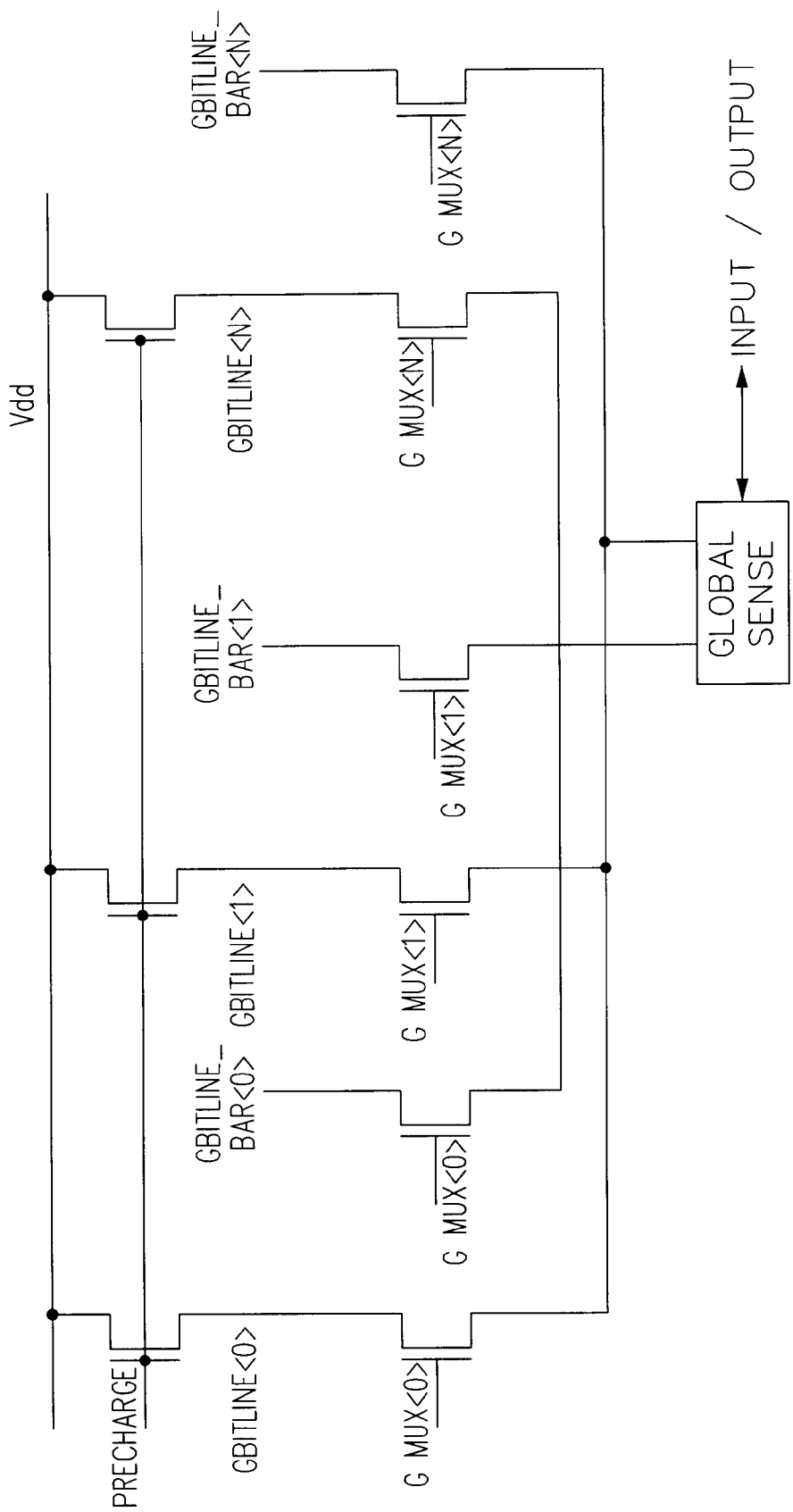
FIG. 11 is a simplified schematic of an analog multiplexing scheme, according to one embodiment of the present invention.

FIG. 11 is an exemplary simplified schematic of the analog multiplexing scheme of the present invention. Each of the global bit lines shown in FIG. 11 include the structure of FIG. 10. From the N global bit lines shown, only one is selected to drive the global sense amplifier. The other (N-1) global bit lines are connected (stay connected) to Vdd signal and therefore are disconnected from the global sense amplifier by the respective transistor switches. The selection signals GMux<0> to GMux<N> are driven by the address decoder and only one is activated for selection of a particular memory cell.

As described above, the present invention is capable of connecting every n DRAM cells to n/2 local sense amplifiers and one global sense amplifier. This provides the area of n DRAM cells to lay out one global sense amplifier which results in substantial area savings and allows for more flexibility in dealing with large spectrum of memory array configurations It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope of the invention as defined by the appended claims.

What is claimed is:

1. A RAM having a plurality of local bit lines and a plurality of global bit lines comprising:

means for coupling a local bit line of the plurality of local bit lines to a respective global bit line of the plurality of global bit lines;

means for selecting a local bit line of the plurality of local bit lines and a respective global bit line of the plurality of global bit lines for a write operation; and means for coupling non-selected global bit lines to a vdd signal during the write operation.

2. The RAM of claim 1, wherein the means for coupling a local bit line to a respective global bit line comprises of a MOS transistor.

3. The RAM of claim 1, further comprising means for sensing a respective data cell and writing data to the respective data cell during the write operation.

4. The RAM of claim 1, further comprising means for limiting voltage swing development on each of the plurality of global bit lines.

5. The RAM of claim 1, further comprising means for refreshing data cells corresponding to non-selected global bit lines during the write operation.

6. The RAM of claim 1, wherein the plurality of global bit lines comprises eight global bit lines.

7. The RAM of claim 1, wherein the plurality of global bit lines comprises sixteen global bit lines.

8. The RAM of claim 1, wherein the plurality of global bit lines comprises thirty two global bit lines.

9. A method for writing data to a RAM having a plurality of local bit lines and a plurality of global bit lines comprising:

coupling a local bit line of the plurality of local bit lines to a respective global bit line of the plurality of global bit lines;

selecting a local bit line of the plurality of local bit lines and a respective global bit line of the plurality of global bit lines during the writing data; and coupling non-selected global bit lines to a vdd signal during the writing data.

10. The method of claim 9, further comprising sensing a respective data cell and writing the data to the respective data cell.

11. The method of claim 9, further comprising limiting voltage swing development on each of the plurality of global bit lines.

12. The method of claim 9, further comprising refreshing data cells corresponding to non-selected global bit lines.

13. A RAM with differential local sensing means comprising:

an odd block of data cells including a plurality of data cell subsets, wherein each of the data cell subsets is coupled to a respective odd bit line;

an even block of data cells including a plurality of data cell subsets, wherein each of the data cell subsets is coupled to a respective even bit line; and a plurality of local sense amplifiers positioned between the odd block of data cells and the even block of data cells, wherein each local sense amplifier of the plurality of local sense amplifiers is shared by a respective odd bit line, a respective even bit line, and a respective global bit line, and comprises of:

four transistors configured as two cross-coupled latches having a first output and a second output;

a first gate transistor for coupling the first output of the two cross-coupled latches to the respective global bit line; and a second gate transistor for coupling the second output of the two cross-coupled latches to a complement signal of the respective global bit line.

14. The RAM of claim 13, wherein the each local sense amplifier of the plurality of local sense amplifiers further comprises a current sink transistor coupled between the two cross-coupled latches and a ground signal.

15. The RAM of claim 13, wherein the first gate transistor and the second gate transistor are configured to limit voltage swing on the respective global bit line for read and write cycles.

16. The RAM of claim 13, wherein the first gate transistor and the second gate transistor are NMOS transistors.

17. The RAM of claim 13, wherein the two cross-coupled latches comprise of two NMOS transistors and two PMOS transistors.

* * * * *